United States Patent
Kim et al.

(10) Patent No.: US 7,345,949 B2
(45) Date of Patent: Mar. 18, 2008

(54) SYNCHRONOUS SEMICONDUCTOR MEMORY DEVICE

(75) Inventors: Kyoung-Nam Kim, Kyoungki-do (KR); Sang-Hee Kang, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 237 days.

(21) Appl. No.: 11/325,937

(22) Filed: Dec. 30, 2005

(65) Prior Publication Data

US 2007/0002641 A1  Jan. 4, 2007

(30) Foreign Application Priority Data

Jun. 30, 2005 (KR) .................. 10-2005-0058713

(51) Int. Cl.
*G11C 8/00* (2006.01)
(52) U.S. Cl. ...................... 365/233; 365/240
(58) Field of Classification Search .............. 365/233, 365/240, 189.05
See application file for complete search history.

(56) References Cited

U.S. PATENT DOCUMENTS

| | | | |
|---|---|---|---|
| 6,079,023 A | 6/2000 | Yoon | |
| 6,215,722 B1 * | 4/2001 | Park | 365/230.06 |
| 7,042,777 B2 * | 5/2006 | Oh | 365/194 |
| 7,251,172 B2 * | 7/2007 | Faue et al. | 365/194 |
| 2005/0270890 A1 * | 12/2005 | Kim | 365/233 |

FOREIGN PATENT DOCUMENTS

| | | |
|---|---|---|
| JP | 2-112274 | 4/1990 |
| KR | 10-0268244 | 7/2000 |
| KR | 10-2004-0103207 | 12/2004 |

* cited by examiner

*Primary Examiner*—Anh Phung
(74) *Attorney, Agent, or Firm*—Blakely Sokoloff Taylor & Zafman

(57) ABSTRACT

A synchronous semiconductor memory device of the present invention includes: an operation controller for outputting a column active sense pulse in response to a column address and a column command signal; a shift register controller, activated in response to the column active sense pulse, for dividing a clock signal by N to thereby output a divided clock signal, N being a positive integer greater than 1; a plurality of shift registers connected in series and synchronized with the divided clock signal, wherein each shift register transmits the column active sense pulse to the next shift register; and a column active control signal generator for logically combining outputs of the shift registers to thereby generate a column active control signal.

11 Claims, 10 Drawing Sheets

SYNCHRONOUS SEMICONDUCTOR MEMORY DEVICE

FIELD OF THE INVENTION

The present invention relates to a synchronous semiconductor memory device; and, more particularly, to a synchronous semiconductor memory device for decreasing a chip size and a current consumption by using a divided clock.

DESCRIPTION OF RELATED ARTS

An internal voltage generator in a semiconductor memory device is a circuit for receiving an external voltage and a ground voltage to thereby generate an internal voltage having various levels. Due to the internal voltage generator, it is possible to reduce an electric power consumption of the semiconductor memory device and to improve a performance of the semiconductor memory device.

FIG. 1 is a block diagram describing a conventional semiconductor memory device.

As shown, the conventional semiconductor memory device includes a command decoder 10, an internal voltage generation controller 20, and a first and a second internal voltage generator 30 and 40.

The command decoder 10 receives and decodes a command signal CMD and a bank address signal BA to thereby output active signals RACTP and CACTP and a precharge signal RPCGBP.

The internal voltage generation controller 20, to which the active signals RACTP and CACTP and the precharge signal RPCGBP are inputted, generates an internal voltage enable signal VINT_ACT.

The first and the second internal voltage generators 30 and 40 commonly receive an internal reference voltage REF_VINT to respectively generate a first and a second internal voltage VINT1 and VINT2. Herein, the first and the second internal voltage generators 30 and 40 are enabled in response to the internal voltage enable signal VINT_ACT and a bias voltage VBIAS, respectively.

The first internal voltage VINT1 is used in an active mode and the second internal voltage VINT2 is used in a stand-by mode.

FIG. 2 is a schematic circuit diagram depicting the first internal voltage generator 30 shown in FIG. 1.

As shown in FIG. 2, the first internal voltage generator 30 is enabled in response to the internal voltage enable signal VINT_ACT to thereby generate the first internal voltage VINT1 having a predetermined voltage level which corresponds to a voltage level of the reference voltage REF_VINT.

FIG. 3 is a schematic circuit diagram showing the second internal voltage generator 40 shown in FIG. 1.

The second internal voltage generator 40 is enabled in response to the bias voltage VBIAS to thereby generate the second internal voltage VINT2 having a preset voltage level which corresponds to the voltage level of the reference voltage REF_VINT. Ordinarily, the second internal voltage generator 40 is almost always enabled to generate the second internal voltage VINT2 except a special case such as a test mode.

FIG. 4 is a block diagram describing the internal voltage generation controller 20 shown in FIG. 1.

Referring to FIG. 4, the internal voltage generation controller 20 includes a row active controller 21, a column active controller 22, a row precharge controller 23, and an enable signal generator 24. The three controllers 21 to 23 detect an operation mode of the semiconductor memory device, and the enable signal generator 24 logically combines a row active control signal RA_ACT, a column active control signal CA_ACT, and a precharge control signal RP_ACT, which are respectively outputted from the three controllers 21 to 23, to thereby output the internal voltage enable signal VINT_ACT.

Herein, the operation mode of the semiconductor memory device is roughly classified into an active mode, a read/write mode, and a precharge mode. In the active mode, a word line is selected according to a row address and data stored in cells connected to the word line are sensed and amplified. In the read/write mode, a certain cell corresponding to a column address is selected from the cells selected by the row address. Then, a data stored in the certain cell is outputted or an external data is stored in the certain cell. Finally, in the precharge mode, bit lines are precharged to prepare the next operation.

Further, the active mode and the precharge mode are referred to as a row operation mode and the read/write mode is referred to as a column operation mode.

In detail, the row active controller 21 receives the row active signal RACTP and outputs the row active control signal RA_ACT for providing a memory core with an internal voltage required in the active mode. The column active controller 22 receives the column active signal CACTP and a clock signal CLK and outputs the column active control signal CA_ACT for providing the memory core with an internal voltage required in the read/write mode. The row precharge controller 23 receives the precharge signal RPCGBP and outputs the precharge control signal RP_ACT for supplying the memory core with an internal voltage required in the precharge mode. Herein, the column active signal CACTP is generated when the bank address, the column address, and a column command are inputted and synchronized with the clock signal CLK.

Further, the enable signal generator 24 contains a NOR gate NR0 and an inverter IV3. The enable signal generator 24 enables the internal voltage enable signal VINT_ACT when at least one of the row active control signal RA_ACT, the column active control signal CA_ACT, and the precharge control signal RP_ACT is activated.

On the other hand, the internal voltage enable signal VINT_ACT is deactivated when all of the row active control signal RA_ACT, the column active control signal CA_ACT, and the precharge control signal RP_ACT are inactivated.

As a result, in response to the enabled internal voltage enable signal VINT_ACT provided from the internal voltage generation controller 20, the first internal voltage generator 30 generates the first internal voltage VINT1 during the active mode, the read/write mode, and the precharge mode.

FIG. 5 is a block diagram showing the column active controller 22 shown in FIG. 4.

As described in FIG. 5, the column active controller 22 includes a plurality of shift registers and a column active control signal generator 22A. The shift registers are connected in series and each shift register transmits the column active signal CACTP to a neighboring shift register by being synchronized with the clock signal CLK.

The column active control signal generator 22A includes a NOR gate NR1 and an inverter IV4 for logically combining the column active signal CACTP and outputs L1 to L7 of the shift registers to thereby output the column active control signal CA_ACT.

FIG. 6 is a timing diagram demonstrating an operation of the column active controller 22 shown in FIG. 5.

As shown in FIG. 6, the column active control signal CA_ACT becomes logically high after the column active signal CACTP is activated as a logic level 'H' in response to a read/write command and becomes logically low when the output L7 of the last shifter register becomes logically low. That is, an activation length of the column active control signal CA_ACT is determined by the number the shift registers.

Meanwhile, the number of the shift registers included in the column active controller 22 is determined according to a CAS latency and a burst length. In FIG. 6, the CAS latency is 3 clocks and the burst length is 4 clocks and, therefore, seven numbers of shifter registers are required.

FIG. 7 is a block diagram describing the column active controller 22 in a general case.

When the burst length is A and the CAS latency is B, the number of shift registers M becomes A+B, A and B being positive integers. If A and B are increased, the number of shifter registers M included in the column active controller 22 has to be increased. By synchronized with the clock signal CLK, each shift register consumes a large amount of current. Therefore, as the number of the shift registers is increased, the current consumption of the internal voltage generator is also increased.

Meanwhile, the shift register synchronized with the clock signal CLK is required to obtain the column active control signal CA_ACT having an activated period corresponding to the CAS latency and the burst length regardless of a variation of an operation frequency. Therefore, the column active controller 22 must include the shift registers synchronized with the clock signal CLK.

Further, when the number of the shift registers is increased, the chip size is also increased.

SUMMARY OF THE INVENTION

It is, therefore, an object of the present invention to provide a synchronous semiconductor memory device for decreasing a chip size and an amount of the operational current.

In accordance with an aspect of the present invention, there is provided a synchronous semiconductor memory device, including: an operation controller for outputting a column active sense pulse in response to a column address and a column command signal; a shift register controller, activated in response to the column active sense pulse, for dividing a clock signal by N to thereby output a divided clock signal, N being an positive integer greater than 2; a plurality of shift registers connected in series and synchronized with the divided clock signal, wherein each shift register transmits the column active sense pulse to the next shift register; and a column active control signal generator for logically combining outputs of the shift registers to thereby generate a column active control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a synchronous semiconductor memory device in accordance with the present invention will be described in detail referring to the accompanying drawings.

Figure 8:
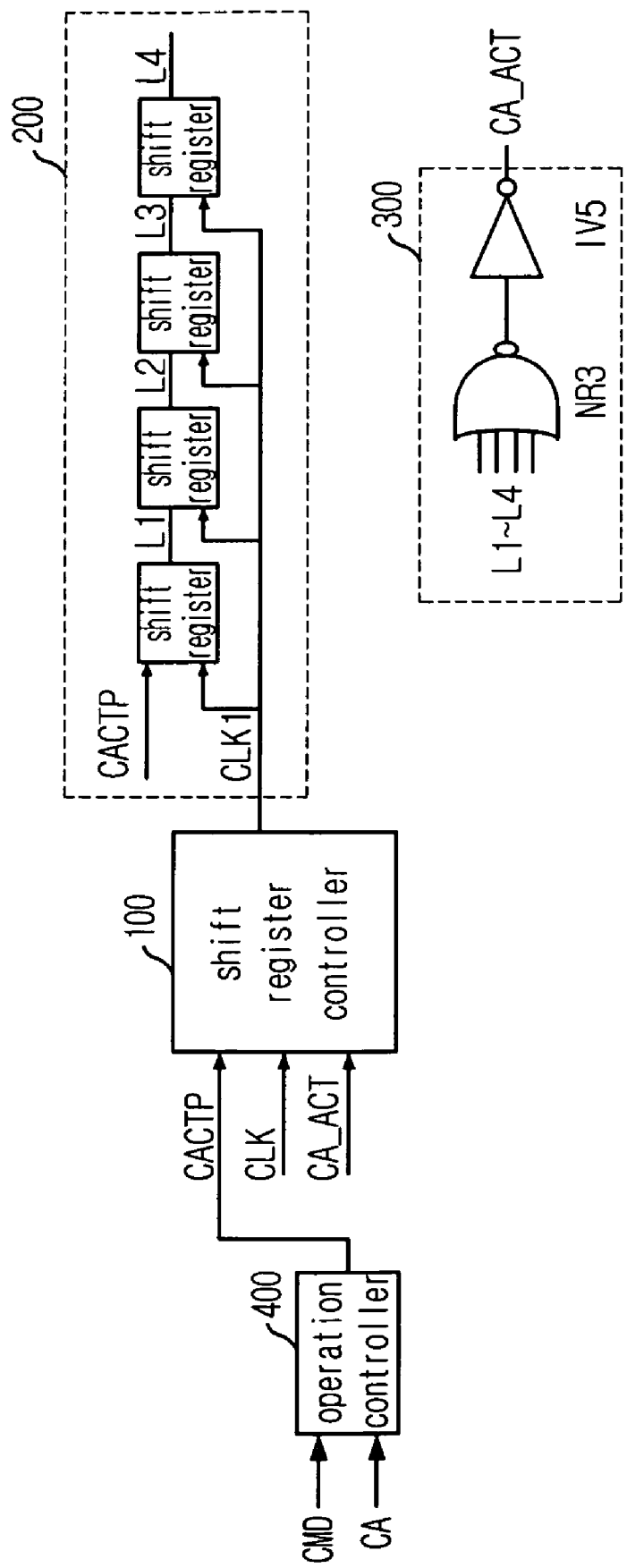
FIG. 8 is a block diagram showing a column active controller of the synchronous semiconductor memory device in accordance with a preferred embodiment of the present invention.

FIG. 8 is a block diagram showing a column active controller of the synchronous semiconductor memory device in accordance with a preferred embodiment of the present invention.

As shown, the column active controller of the present invention includes an operation controller 400, a shift register controller 100, a plurality of shift registers 200, and a column active control signal generator 300.

The operation controller 400 receives a column address CA and a command signal CMD corresponding to the column address CA and outputs a column active sense pulse CACTP.

The shift register controller 100, activated in response to the column active sense pulse CACTP, divides a clock signal CLK by a positive integer to thereby output a divided clock signal CLK1. Further, the shift register controller 100 is disabled in response to the deactivation of a column active control signal CA_ACT.

The shift registers 200, connected in series and synchronized with the divided clock signal CLK1, transmits the column active sense pulse CACTP to the next shift register. The number of the shift registers 200 is determined according to a burst length BL and a CAS latency CL.

The column active control signal generator 300 logically combines outputs L1 to L4 of the shift registers 200 to generate the column active control signal CA_ACT. As shown in FIG. 8, the column active control signal generator 300 includes a NOR gate NR3 for receiving the outputs L1 to L4 of the shift registers 200 and an inverter IV5 for inverting an output of the NOR gate NR3.

Figure 9:
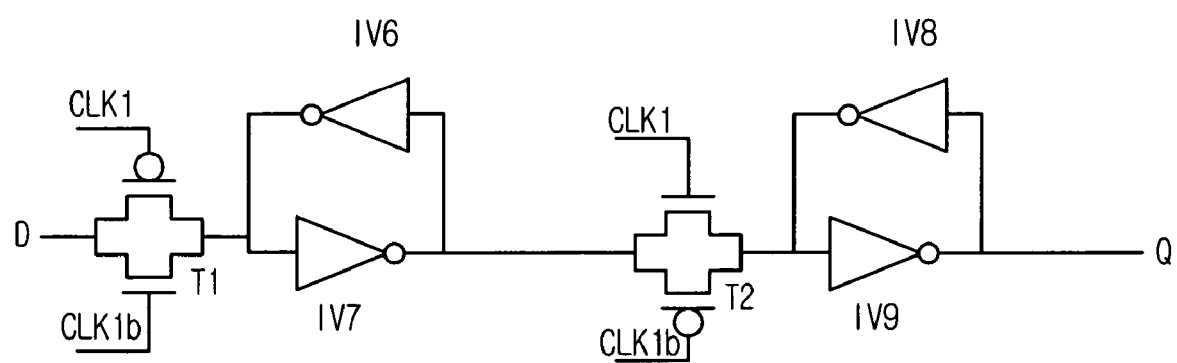
FIG. 9 is a schematic circuit diagram depicting each of shift registers shown in FIG. 8.

FIG. 9 is a schematic circuit diagram depicting each of the shift registers 200 shown in FIG. 8.

As shown, each of the shift registers 200 includes two transmission gates T1 and T2 and two latches respectively provided with two inverters. The first transmission gate T1 transmits the column active sense pulse CACTP inputted through its input terminal D in response to a logic low level of the divided clock signal CLK1. The first latch provided with the inverters IV6 and IV7 latches an output of the first transmission gate T1. The second transmission gate T2 transmits an output of the first latch in response to a logic high level of the divided clock signal CLK1. The second latch provided with the inverters IV8 and IV9 latches and outputs an output of the second transmission gate T2 to an output terminal Q.

Figure 10A:
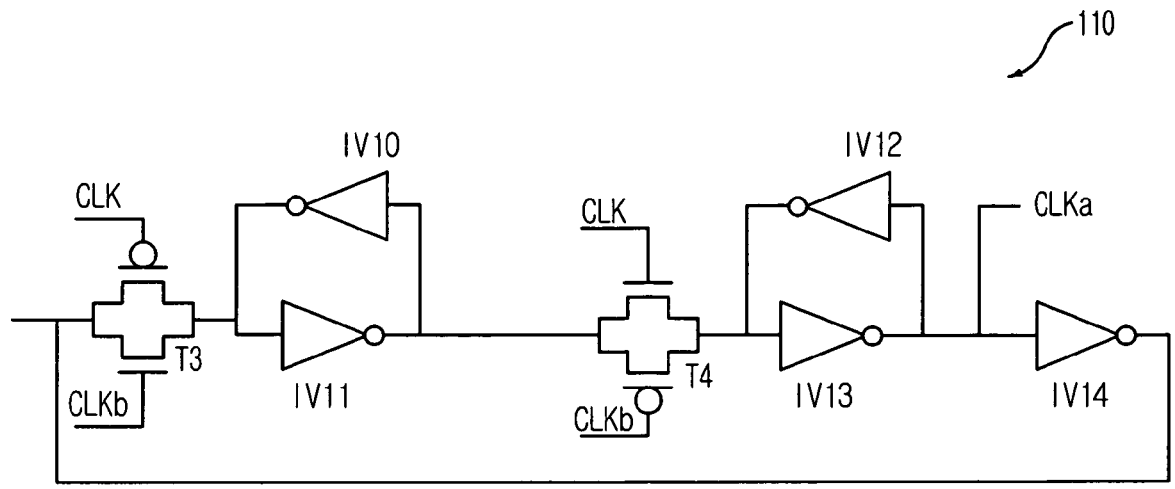
FIGS. 10A to 10C are schematic circuit diagrams describing the shift register controller 100 shown in FIG. 8.
Figure 10B:
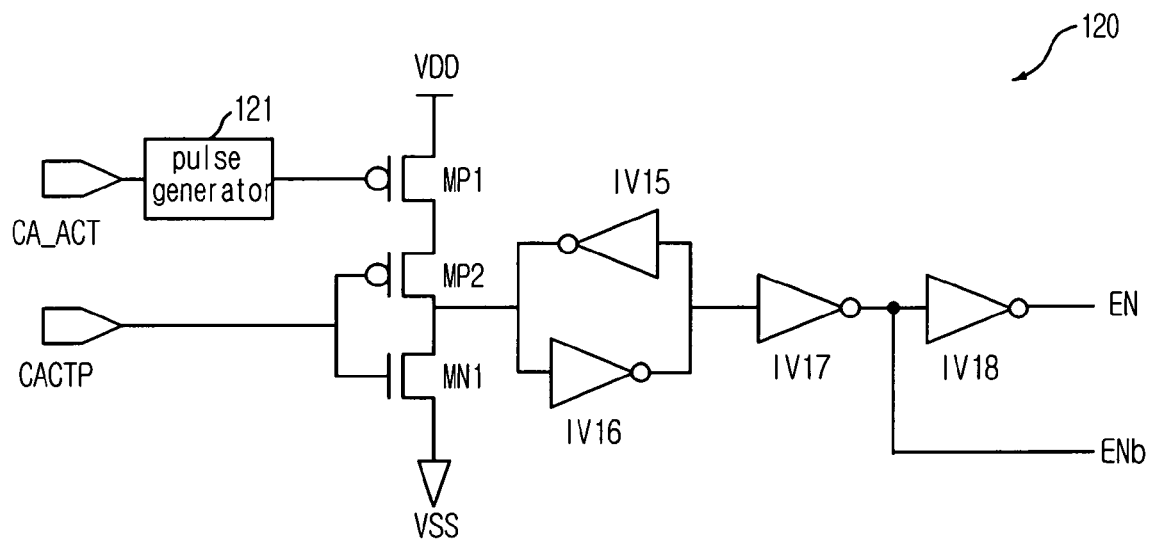
Figure 10C:
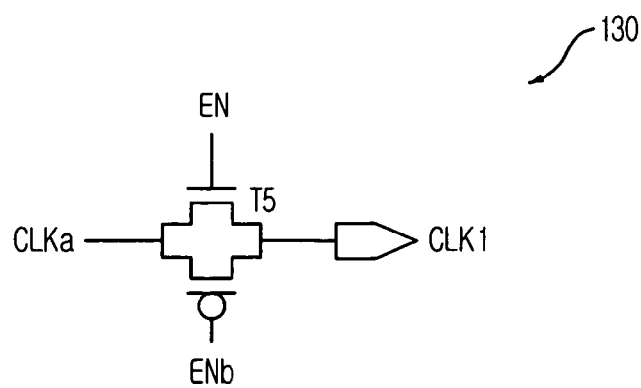

FIGS. 10A to 10C are schematic circuit diagrams describing the shift register controller 100 shown in FIG. 8.

As shown, the shift register controller 100 includes a clock divider 110, an enable controller 120, and a divided clock generator 130.

As shown in FIG. 10A, the clock divider 110 for dividing the clock signal CLK is provided with two transmission gates T3 and T4, two latches respectively provided with two inverters, and an inverter IV14. The third transmission gate T3 transmits a signal received through its input terminal in response to the clock signal CLK of a logic low level. The third latch provided with the inverters IV10 and IV11 latches an output of the third transmission gate T3. The fourth transmission gate T4 transmits an output of the third latch in response to the clock signal CLK of a logic high level. The fourth latch provided with the inverters IV12 and IV13 latches an output of the fourth transmission gate T4. The inverter IV14 inverts an output CLKa of the fourth latch and transmits the inverted output to the third transmission gate T3.

Referring to FIG. 10B, the enable controller 120 generates an enable signal EN in response to the column active sense pulse CACTP and the column active control signal CA_ACT. The enable controller 120 contains a pulse generator 121, two PMOS transistor MP1 and MP2, a NMOS transistor MN1, a fifth latch provided with inverters IV15 and IV16, and a buffer provided with inverters IV17 and IV18.

The pulse generator 121 senses a falling edge of the column active control signal CA_ACT to thereby generate a pulse in response to a deactivation of the column active control signal CA_ACT. The first PMOS transistor MP1, whose first terminal is connected to a power supply voltage VDD, receives an output of the pulse generator 121. The second PMOS transistor MP2, whose first terminal is connected to a second terminal of the first PMOS transistor MP1, receives the column active sense pulse CACTP through a gate thereof. The NMOS transistor MN1 connected between a second terminal of the second PMOS transistor MP2 and a ground voltage VSS receives the column active sense pulse CACTP through a gate thereof.

Further, the fifth latch latches a signal in a common node of the second PMOS transistor MP2 and the first NMOS transistor MN1. The buffer provided with the inverters IV17 and IV18 buffers the signal latched in the fifth latch to thereby output the enable signal EN.

Further, as described in FIG. 10C, the divided clock generator 130 includes a fifth transmission gate T5. The fifth transmission gate T5 is turned on in response to the enable signal EN to output the divided clock signal CLK1.

Figure 11:
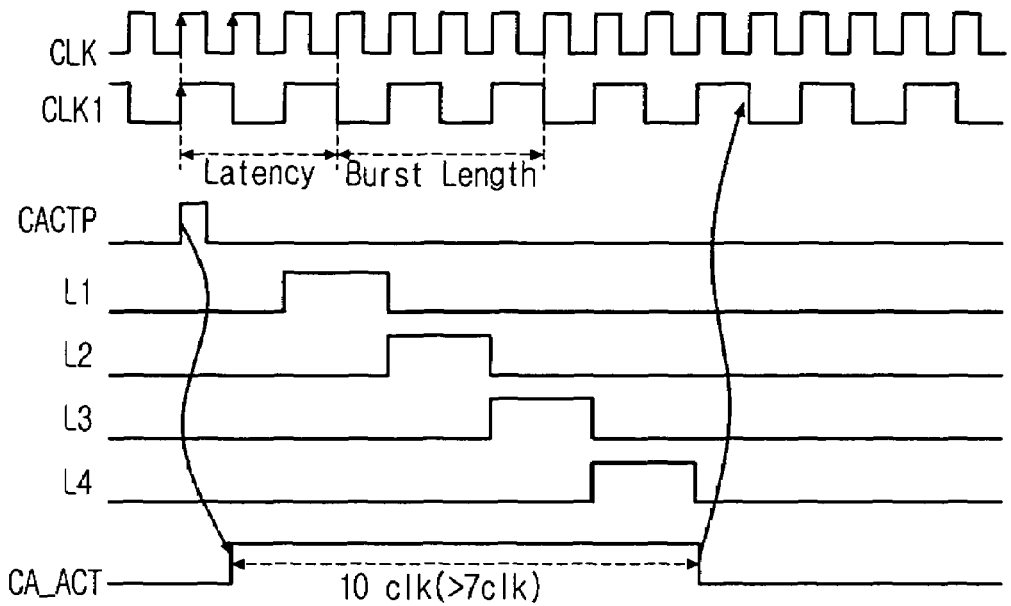
FIGS. 11 and 12 are timing diagrams demonstrating an operation of the column active controller shown in FIG. 8.
Figure 12:
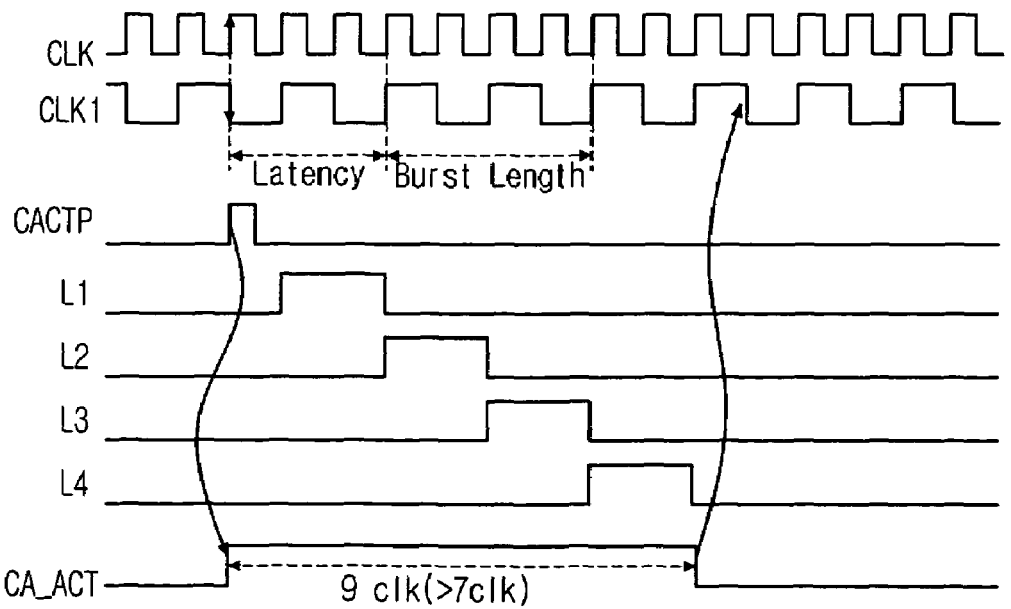

FIGS. 11 and 12 are timing diagrams demonstrating an operation of the column active controller shown in FIG. 8.

The operation controller 400 receives the column address CA and the command signal CMD corresponding to the column address CA to output the column active sense pulse CACTP. The shift register controller 100 activated in response to the column active sense pulse CACTP divides the clock signal CLK to thereby generate the divided clock signal CLK1. In case of FIGS. 11 and 12, the clock signal CLK is divided by 2.

Further, the shift registers 200 serially connected to one another transmit the column active sense pulse CACTP to a next shift register by synchronized with a divided clock signal CLK1. The column active control signal generator 300 logically combines the outputs L1 to L4 of the shift registers 200 to generate the column active control signal CA_ACT. The column active control signal CA_ACT is activated while the outputs L1 to L4 of the shift registers 200 are outputted. An internal voltage generator generates an internal voltage VINT, which will be provided to a core area of the semiconductor memory device, in response to the column active control signal CA_ACT.

The shift register controller 100 receives the column active control feedback signal CA_ACT and stops outputting the divided clock signal CLK1 at the falling edge of the column active control signal CA_ACT. That is, the shift register controller 100 outputs the divided clock signal CLK1 in response to the column active sense pulse CACTP and stops outputting the divided clock signal CLK1 when the column active control signal CA_ACT is deactivated.

Figure 1:
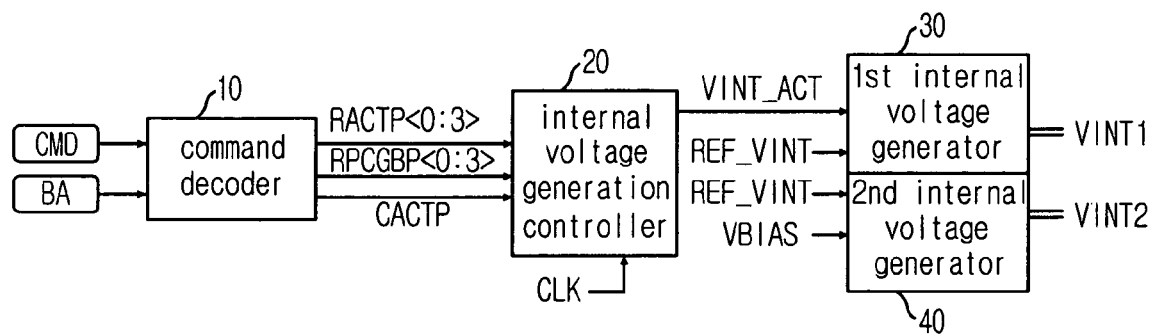
FIG. 1 is a block diagram describing a conventional semiconductor memory device.
Figure 2:
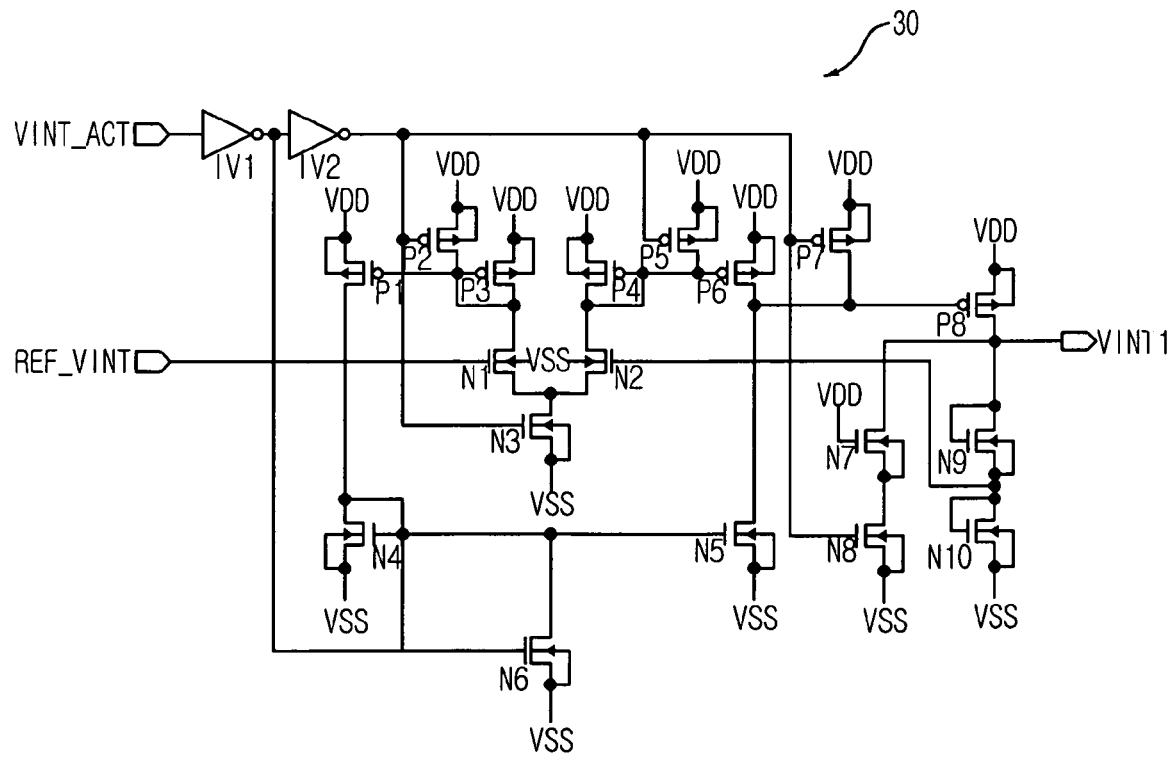
FIG. 2 is a schematic circuit diagram depicting a first internal voltage generator shown in FIG. 1.
Figure 3:
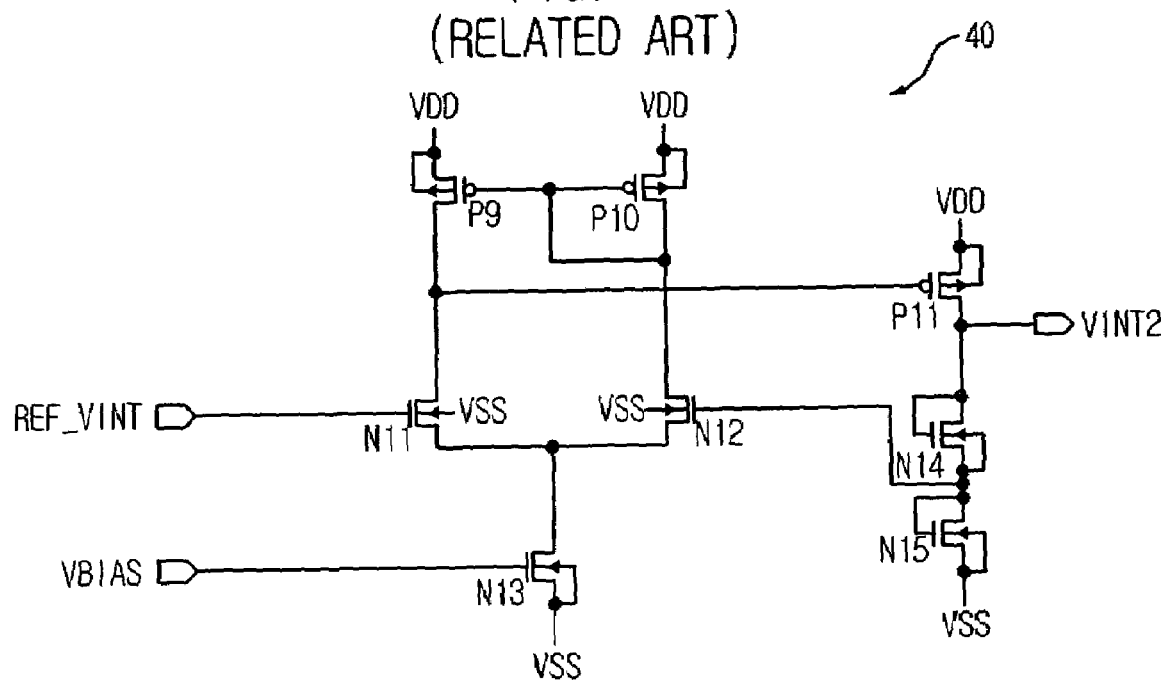
FIG. 3 is a schematic circuit diagram showing a second internal voltage generator shown in FIG. 1.
Figure 4:
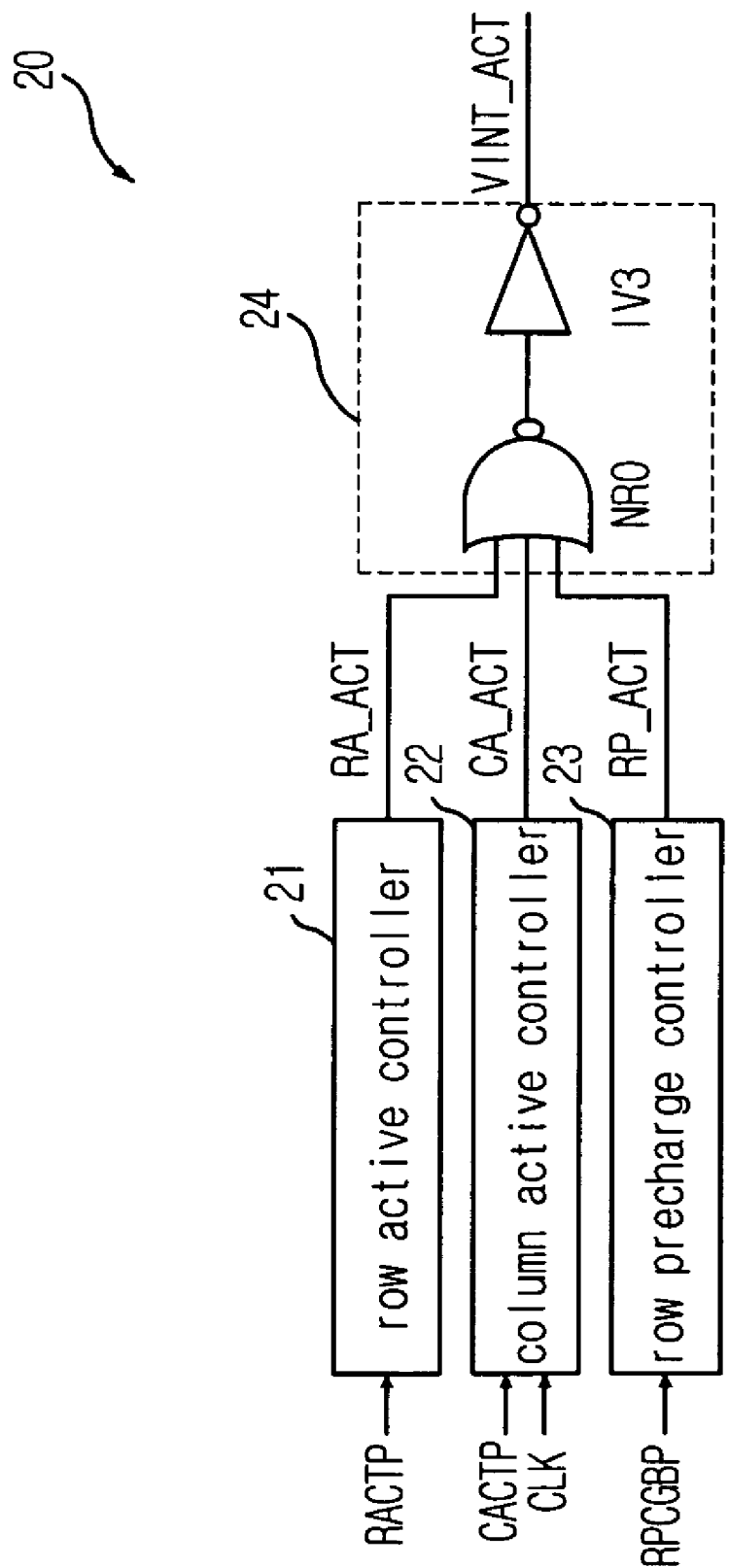
FIG. 4 is a block diagram describing an internal voltage generation controller shown in FIG. 1.
Figure 5:
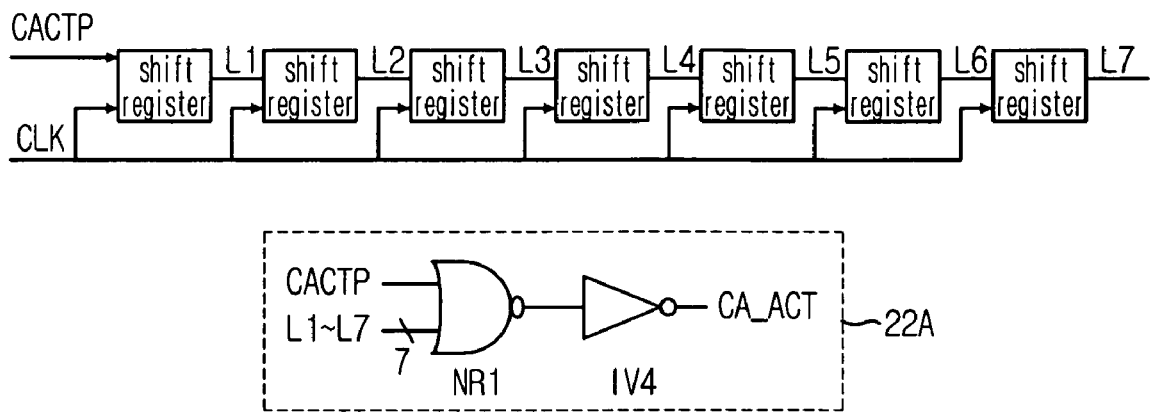
FIG. 5 is a block diagram showing a column active controller shown in FIG. 4.
Figure 6:
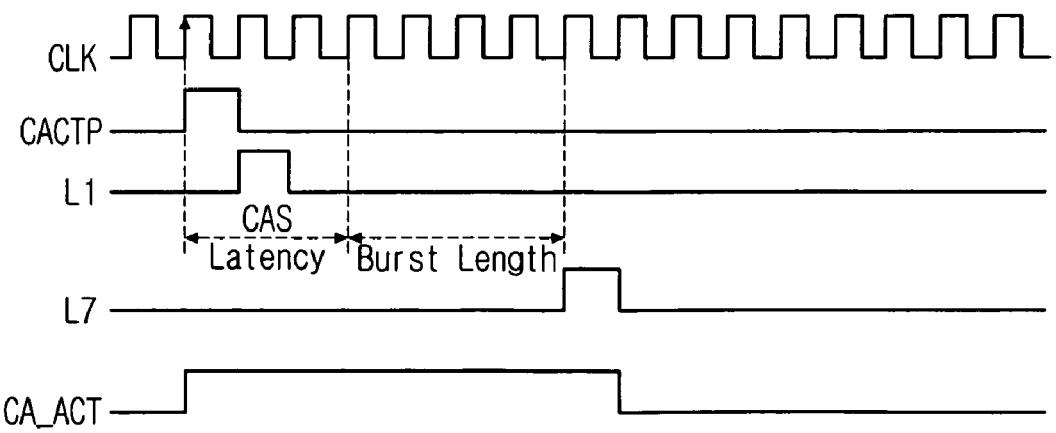
FIG. 6 is a timing diagram demonstrating an operation of the column active controller 22 shown in FIG. 5.
Figure 7:
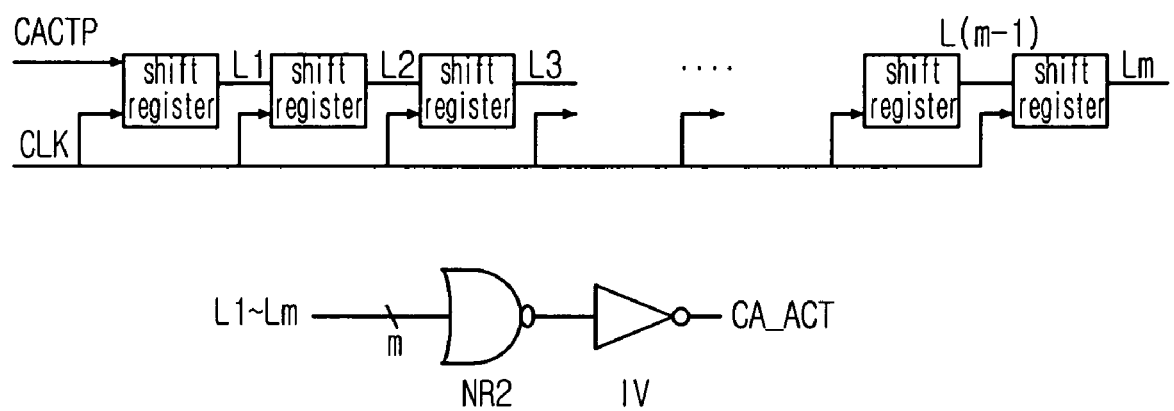
FIG. 7 is a block diagram describing the column active controller in a general case.

The activation length of the column active control signal CA_ACT is determined by the CAS latency and the burst length. When the CAS latency is 3 clocks and the burst length is 4 clocks, the column active control signal CA_ACT must be activated for 7 clocks as shown in FIG. 11. In order to activate the column active control signal CA_ACT for 7 clocks, the conventional semiconductor memory device shown in FIG. 1 use seven shift registers. However, the present invention is implemented with only four shift registers by using the divided clock signal CLK1.

Therefore, by reducing the number of the shift registers for generating the column active control signal CA_ACT, the present invention can decrease the chip size and the amount of current consumption. Thus, the present invention reduces an operation current of the semiconductor memory device.

In FIG. 12, the operation of the present invention when the CAS latency is 3 clocks, the burst length is 4 clocks, and the divided clock has the opposite phase with the clock signal CLK is shown. As shown in FIG. 12, the present invention is properly operated when the divided clock signal CLK has the opposite phase with the clock signal CLK.

Figure 13:
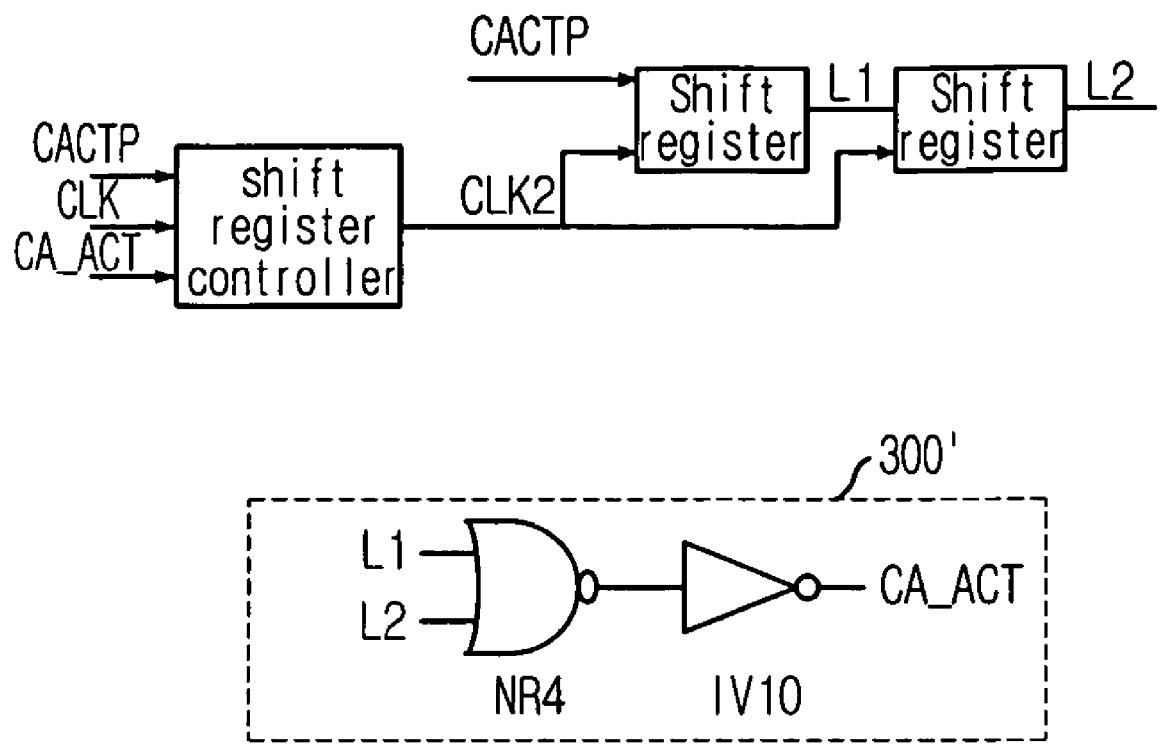
FIG. 13 is block diagram showing a column active controller in accordance with a second embodiment of the present invention.

FIG. 13 is block diagram showing a column active controller in accordance with a second embodiment of the present invention.

Compared with FIG. 8, the column active controller shown in FIG. 13 divides the clock signal CLK by four. Therefore, only two shift registers are included in the column active controller to generate the column active control signal CA_ACT. That is, when the CAS latency is 3 clocks and the burst length is 4 clocks, the column active controller with two shift registers generates the column active control signal CA_ACT having the activation length corresponding to 7 clocks.

The present invention dramatically reduces the chip size and an amount of the operational current by using a divided clock in the column active controller.

The present application contains subject matter related to Korean patent application No. 2005-58713, filed in the Korean Patent Office on Jun. 30, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A synchronous semiconductor memory device, comprising:
   an operation controller for outputting a column active sense pulse in response to a column address and a column command signal;
   a shift register controller, activated in response to the column active sense pulse, for dividing a clock signal by N to thereby output a divided clock signal, N being a positive integer greater than 1;
   a plurality of shift registers connected in series and synchronized with the divided clock signal, wherein each shift register transmits the column active sense pulse to the next shift register; and
   a column active control signal generator for logically combining outputs of the shift registers to generate a column active control signal.

2. The synchronous semiconductor memory device as recited in claim 1, wherein the number of the shift registers is determined by a CAS latency and a burst length.

3. The synchronous semiconductor memory device as recited in claim 2, wherein the shift register controller is inactivated in response to a deactivation of the column active control signal.

4. The synchronous semiconductor memory device as recited in claim 3, wherein the shift register controller includes:
   a clock divider for dividing the clock signal;
   an enable controller for outputting an enable signal which is activated in response to the column active sense pulse and inactivated in response to the deactivation of the column active control signal; and
   a divided clock generator for outputting the divided clock signal in response to the enable signal.

5. The synchronous semiconductor memory device as recited in claim 4, wherein the clock divider divides the clock signal by two or four.

6. The synchronous semiconductor memory device as recited in claim 4, wherein the clock divider has:
   a first transmission gate for transmitting a signal received through its input terminal in response to a first logic level of the clock signal;
   a first latch for latching the signal transmitted through the first transmission gate;
   a second transmission gate for transmitting the signal latched in the first latch in response to a second logic level of the clock signal;
   a second latch for latching the signal transmitted through the second transmission gate; and
   an inverter for inverting the signal latched in the second latch, wherein the inverted signal is inputted to the first transmission gate.

7. The synchronous semiconductor memory device as recited in claim 6, wherein the enable controller has:
   a pulse generator for generating a pulse in response to the deactivation of the column active control signal;
   a first PMOS transistor whose first terminal is connected to a power supply voltage terminal and gate receives the pulse outputted from the pulse generator;
   a second PMOS transistor whose first terminal is connected to a second terminal of the first PMOS transistor and gate receives the column active sense pulse;
   an NMOS transistor, connected between a second terminal of the second PMOS transistor and a ground voltage terminal, for receiving the column active sense pulse through its gate;
   a third latch for latching a signal outputted from a common node of the second PMOS transistor and the NMOS transistor; and
   a buffer for buffering the signal latched in the third latch to thereby output the enable signal.

8. The synchronous semiconductor memory device as recited in claim 7, wherein the divided clock generator includes a transmission gate, enabled in response to the enable signal, for providing the shift registers with the signal latched in the second latch as the divided clock signal.

9. The synchronous semiconductor memory device as recited in claim 1, further comprising an internal voltage generator for outputting an internal voltage to a core area of the semiconductor device during the activation of the column active control signal.

10. The synchronous semiconductor memory device as recited in claim 9, wherein the column active control signal generator includes:
    a NOR gate for receiving the outputs of the shift registers; and
    an inverter for inverting an output of the NOR gate to thereby output the column active control signal to the internal voltage generator.

11. The synchronous semiconductor memory device as recited in claim 1, wherein each of the shift registers includes:
    a first transmission gate for transmitting a signal received through its input terminal thereof in response to a first logic level of the divided clock signal;
    a first latch for latching the signal transmitted from the first transmission gate;
    a second transmission gate for transmitting the signal latched by the first latch in response to a second logic level of the divided clock signal; and
    a second latch for latching the signal transmitted from the second transmission gate.

* * * * *